(12) United States Patent
Knofe et al.

(10) Patent No.: US 9,888,559 B2
(45) Date of Patent: Feb. 6, 2018

(54) METHOD FOR PRODUCING AN ELECTRONIC COMPONENT, AND ELECTRONIC ASSEMBLY, A HEATING DEVICE BEING PROVIDED IN THE SUBSTRATE OF THE ASSEMBLY

(71) Applicant: Siemens Aktiengesellschaft, Munich (DE)

(72) Inventors: Ruediger Knofe, Teltow (DE); Bernd Mueller, Falkenberg (DE); Andrey Prihodovsky, Bayreuth (DE)

(73) Assignees: SIEMENS AKTIENGESELLSCHAFT, Munich (DE); NEUE MATERIALIEN BAYREUTH GMBH, Bayreuth (DE)

( * ) Notice: Subject to any disclaimer, the term of this patent is extended or adjusted under 35 U.S.C. 154(b) by 0 days.

(21) Appl. No.: 15/325,550

(22) PCT Filed: Jun. 17, 2015

(86) PCT No.: PCT/EP2015/063504
§ 371 (c)(1),
(2) Date: Jan. 11, 2017

(87) PCT Pub. No.: WO2016/005153
PCT Pub. Date: Jan. 14, 2016

(65) Prior Publication Data
US 2017/0164465 A1    Jun. 8, 2017

(30) Foreign Application Priority Data
Jul. 11, 2014    (DE) .................. 10 2014 213 535

(51) Int. Cl.
*H05K 1/02*    (2006.01)
*H05K 3/30*    (2006.01)
(Continued)

(52) U.S. Cl.
CPC ............ *H05K 1/0212* (2013.01); *H05K 1/11* (2013.01); *H05K 3/30* (2013.01); *H05K 3/321* (2013.01);
(Continued)

(58) Field of Classification Search
CPC ........... H05K 1/0212; H05K 1/11; H05K 3/30
(Continued)

(56) References Cited

U.S. PATENT DOCUMENTS 3,440,407 A * 4/1969 Amato .................. H05B 3/00
                                                   219/209
3,887,785 A * 6/1975 Ahlport .................. H05B 3/00
                                                   219/209
(Continued)

FOREIGN PATENT DOCUMENTS

| EP | 1193750 A2 | 4/2002 | ............. H01L 21/60 |
| WO | 2007/072379 A2 | 6/2007 | ........... H05K 1/0284 |
| WO | 2016/005153 A1 | 1/2016 | ............... H05K 1/02 |

OTHER PUBLICATIONS

International Search Report and Written Opinion, Application No. PCT/EP2015/063504, 19 pages, dated Oct. 8, 2015.

*Primary Examiner* — Timothy Thompson
*Assistant Examiner* — Charles Pizzuto
(74) *Attorney, Agent, or Firm* — Slayden Grubert Beard PLLC

(57) ABSTRACT

A method for producing or disassembling an electronic assembly are provided. The assembly may have a heating device integrated into a substrate. The heating device can be heated via an external power supply during the assembly process so that, for example, solder connections of an electric component can be melted. The heating device can also be used when operating the electronic assembly, and the heating device can then be directly actuated by the component. For this purpose, an electric connection is then estab-
(Continued)

lished between the component and the heating device, the connection not yet being provided during the thermal assembly process in order to protect the electronic components of the circuit from being damaged.

15 Claims, 3 Drawing Sheets

(51) Int. Cl.
*H05K 1/11* (2006.01)
*H05K 3/32* (2006.01)
*H05K 3/34* (2006.01)

(52) U.S. Cl.
CPC ........... *H05K 3/34* (2013.01); *H05K 2201/06* (2013.01); *H05K 2201/10053* (2013.01); *H05K 2201/10151* (2013.01); *H05K 2201/10166* (2013.01)

(58) Field of Classification Search
USPC ....................................................... 361/761
See application file for complete search history.

(56) References Cited

U.S. PATENT DOCUMENTS

| | | | | |
|---|---|---|---|---|
| 5,010,233 A | * | 4/1991 | Henschen | B23K 3/0475 219/209 |
| 5,539,186 A | * | 7/1996 | Abrami | H01L 23/34 174/262 |
| 6,396,706 B1 | * | 5/2002 | Wohlfarth | H05K 1/0212 219/388 |

* cited by examiner

METHOD FOR PRODUCING AN ELECTRONIC COMPONENT, AND ELECTRONIC ASSEMBLY, A HEATING DEVICE BEING PROVIDED IN THE SUBSTRATE OF THE ASSEMBLY

CROSS-REFERENCE TO RELATED APPLICATIONS

This application is a U.S. National Stage Application of International Application No. PCT/EP2015/063504 filed Jun. 17, 2015, which designates the United States of America, and claims priority to DE Application No. 10 2014 213 535.4 filed Jul. 11, 2014, the contents of which are hereby incorporated by reference in their entirety.

TECHNICAL FIELD

The invention relates to a method for producing an electronic assembly. A substrate is provided in this method, an electrical heating device being embedded into said substrate beneath the surface which forms a mounting side for components. The mounting side of the substrate is fitted with components and the substrate is heated with the aid of the heating device to a temperature such that a mounting process is assisted. As an alternative, the heating device can provide all of the thermal energy which is required for the thermal mounting process in this case. As an alternative, the heating device can also merely assist the thermal mounting process, wherein further thermal energy can be provided by an external heating device. In this way, the heating device in the substrate can assist, for example, a thermal mounting process in a soldering furnace.

The invention further relates to a method for disassembling at least one part of an electronic assembly, in which method the assembly has a substrate, an electrical heating device being embedded into said substrate beneath the surface which forms a mounting side for components. This electronic assembly is further fitted with components.

BACKGROUND

A thermal mounting process within the meaning of the invention is intended to be understood as all mounting processes of electronic assemblies in which the product is changed to its final state with the aid of thermal energy. Conventional mounting processes comprise joining operations, such as soldering contacts of components on the substrate for example. As an alternative, adhesive bonding can also be performed, wherein a thermal adhesive, that is to say an adhesive which cures under the action of temperature, is used in a thermal mounting process. However, the thermal mounting processes are also intended to be understood to mean the so-called special operations of mounting, such as applying an auxiliary material, such as a thermal coating, which is cured with the aid of heat, for example.

The invention further relates to an electronic assembly which has a substrate, an electrical heating device being embedded in said substrate beneath the surface which forms a mounting side for components. Components which are combined in at least one electronic circuit are mounted on said mounting side.

It is known to embed heating devices in substrate components. According to U.S. Pat. No. 6,396,706 B1, heating elements which are independent of one another can be embedded, for example, in printed circuit boards. According to U.S. Pat. No. 5,539,186, said heating elements can be constructed from sheet resistors or from meandering designs of a heating wire. According to the prior art, the heating devices can be used both for heating the printed circuit board during a mounting process and can also be used for introducing heat in a targeted manner during operation of the completely mounted electronic assembly.

SUMMARY

A method for producing an electronic assembly, in which method a substrate is provided, an electrical heating device being embedded into said substrate beneath the surface which forms a mounting side for components, the mounting side is fitted with components, the substrate is heated with the aid of the heating device to a temperature such that a thermal mounting process is assisted, wherein the heating device is electrically operated independently of the circuits, which are formed by the electronic assembly, during the thermal mounting process, and the heating device is electrically connected to at least one of the circuits of the electronic assembly after the thermal mounting process, wherein the heating device can be operated by this circuit.

In one embodiment, the mounting process includes soldering, adhesive bonding or coating.

In one embodiment, the heating device is supplied with electrical energy by means of a connection, in particular by probe needles or terminals, during the thermal mounting process, wherein the connection is provided by a mounting system in which the production method proceeds.

In one embodiment, the electrical heating device is connected to said electronic circuit by means of plug contacts or solder connections.

In one embodiment, the electrical heating device is connected to said electronic circuit by means of contact pieces, wherein the contact pieces are integrated into a housing component for the electronic assembly and are electrically connected by mounting the housing component on the electronic assembly.

In one embodiment, the electrical heating device is connected to said electronic circuit by means of a switch, in particular a mechanical switch, a diode, a transistor or a relay.

In one embodiment, the substrate is locally heated at different intensities during the thermal mounting process.

In one embodiment, a temperature sensor which is electrically connected to said electronic circuit is provided on the substrate.

In one embodiment, an external control apparatus makes contact with the temperature sensor during the thermal mounting process, wherein the control apparatus is provided by a mounting system in which the production method proceeds, and the control apparatus is used in order to control the energy supply to the heating device.

In one embodiment, the temperature sensor is electrically operated independently of the electronic circuits, which are formed by the electronic assembly, during the thermal mounting process, and the temperature sensor is electrically connected to at least one of the electronic circuits of the electronic assembly after the mounting process, wherein the heating device can be operated by this electronic circuit.

Another embodiment provides a method for disassembling at least one part of an electronic assembly, in which method the assembly has a substrate, an electrical heating device being embedded into said substrate beneath the surface which forms a mounting side for components, the mounting side is fitted with components, wherein the substrate is heated with the aid of the heating device to a temperature such that a thermal disassembly process is assisted, the heating device is electrically operated independently of the electronic circuits, which are formed by the electronic assembly, during the thermal disassembly process, at least one component is removed from the substrate, and the heating device is electrically connected to at least one of the electronic circuits of the electronic assembly after the disassembly process or after a mounting process as disclosed above which follows the disassembly process, wherein the heating device can be operated by said circuit.

Another embodiment provides an electronic assembly, having a substrate, an electrical heating device being embedded in said substrate beneath the surface which forms a mounting side for components, components on the mounting side, which components are combined in at least one electronic circuit, wherein the heating device is electrically connected to at least one of the electronic circuits of the electronic assembly, wherein the heating device can be operated by said electronic circuit, and a contact structure which is accessible from the outside is provided between the heating device and said electronic circuit.

In one embodiment, the contact structure is connected to a switch.

In one embodiment, the heating device has a plurality of segments which can be individually actuated.

In one embodiment, the segments in the substrate lie one beneath the other with respect to the mounting side of the substrate.

BRIEF DESCRIPTION OF THE DRAWINGS

Example aspects and embodiments of the invention are described in detail below with reference to the drawings, in which.

DETAILED DESCRIPTION

Figure 1:
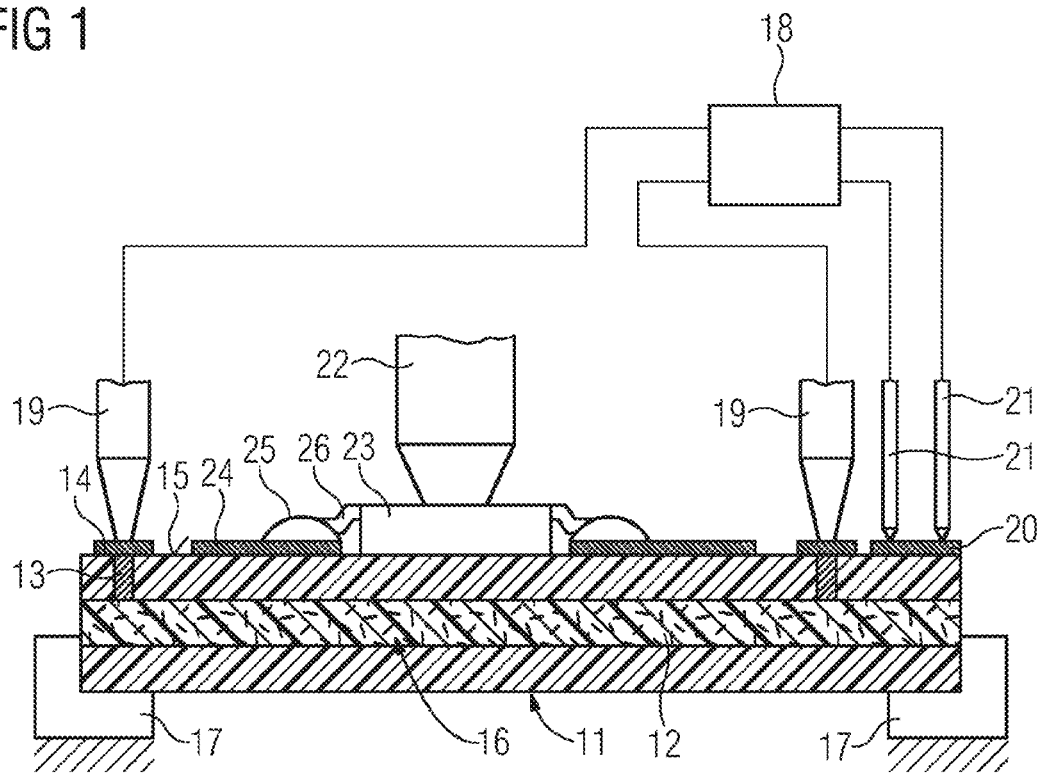
FIGS. 1 and 2 show, schematically in section, different steps of an exemplary embodiment of a mounting method.

Embodiments of the invention provide a method for producing an electronic assembly and also an electronic assembly which can be produced using a method of this kind, in which method and, respectively, in which assembly a thermal mounting process is possible without putting the electronic assembly at risk and operation of the electronic assembly with the aid of the heating device which is integrated in the substrate is possible in a reliable manner.

Some embodiments provide a method in which the heating device is electrically operated independently of the circuits, which are formed by the electronic assembly, during the thermal mounting process. As a result, it is advantageously possible to ensure that there is DC isolation between the circuits of the electronic assembly and the heating device in the substrate. The consequence of this is that the heating device has to be operated by an external actuating means and contact-making means during the thermal mounting process. Contacts on the substrate can be used for this purpose, wherein the manner in which electrical contact is made with said contacts will be described in greater detail below. The power consumption by the heating device, which power consumption is significantly greater, for example, during soldering than during subsequent operation of the electronic assembly, advantageously cannot lead to damage to the electronic assemblies which are being produced owing to the DC isolation.

After the thermal mounting process, the heating device is electrically connected to at least one of the circuits of the electronic assembly, wherein the heating device can be operated by this circuit. In other words, the temperature management for the heating device is integrated into the electronic assembly during operation of the electronic assembly. To this end, it is necessary for the assembly which is located in the substrate to be electrically contact-connected to the circuit in question, so that said circuit can actually actuate the heating device. The power required for this purpose can be provided by the electrical circuit itself, wherein said electrical circuit also has to be supplied with electrical energy for its further functions. However, as already mentioned, the required heating power of the heating device is significantly higher during the thermal mounting process, wherein an external electrical energy source can be used for this purpose, provided that the heating device is not yet connected to the actuating circuit.

Typical mounting processes advantageously may include soldering, adhesive bonding or coating. As already mentioned, coating may be a so-called special operation of mounting, wherein, for example, a protective coating can be applied to the finished electronic assembly in order to provide electrical insulation. A partial coating layer of the substrate (for example of a printed circuit board or else a housing component of which the surface is intended to serve as a substrate for an electronic circuit) can also be applied before the component-fitting operation. Soldering is conventionally used to establish reliable electrical connections, wherein, in particular, lead-free soldering materials have led to the need for higher joining temperatures in recent years. An extremely wide variety of components of the electronic circuit can be reliably connected to the substrate by adhesive bonding. So-called conductive adhesives, which are suitable for establishing an electrical connection at the same time, can also be used here.

In one embodiment, the heating device is supplied with electrical energy by means of a connection, in particular by probe needles or terminals, during the thermal mounting process. The connection is provided by a mounting system in which the production method proceeds here. The mounting system may be modified to the effect that the mounting method can be carried out. For the purpose of initiating the thermal mounting process, the connections are routed to suitable contact areas of the substrate, so that the heating device can be supplied with electric current in order to initiate the heating process. An energy source which is provided by the mounting system can advantageously be used here. The mounting system may be, for example, an automatic component-fitting machine, wherein the electronic assembly can advantageously be completely mounted in said automatic component-fitting machine since the thermal mounting process can be concluded by introducing electrical energy into the heating device (without the use of a soldering furnace). As an alternative, it is also possible for the connections to be provided in a reflow soldering furnace, wherein the energy required for the thermal mounting is provided only partially by the heating device in order to assist the input of heat to the reflow soldering furnace. Here, it is possible, for example, for regions of the electronic assembly which require a higher energy supply for thermal mounting during reflow soldering than the rest of the electronic assembly to be assisted with thermal energy from the heating device. Overall, this leads to a lower thermal loading on the electronic assembly during the thermal mounting.

In one embodiment, the electrical heating device is connected to said electronic circuit by means of plug contacts or solder connections. Said electronic circuit is that circuit which ensures operation of the heating device in parallel with operation of the electronic circuit after conclusion of the thermal mounting process. If plug contacts are provided for the electrical connection, contact can advantageously be made by way of a plug connector, wherein plugging in a plug connector constitutes a simple mounting operation which can be carried out following the thermal mounting process. However, a solder connection can also be used for this purpose. Although the solder connection itself can also be produced only by a thermal mounting process, this solder connection can be established manually and merely requires local heating of the substrate at the location of the solder connection. This location can advantageously be chosen such that the thermal loading of the subsequent soldering process is not critical for the rest of the electronic assembly. Forming a solder connection is advantageously particularly reliable when, for example, the electronic assembly is subject to shocks and vibrations.

In one embodiment, the electrical heating device is connected to said electronic circuit by means of contact pieces, wherein the contact pieces are integrated into a housing component for the electronic assembly and are electrically connected by mounting the housing component on the electronic assembly. This has the major advantage that the connection of the integrated heating device to the circuit which controls this heating device during operation of the electronic assembly is established by a mounting operation which is provided during the course of mounting in any case. This mounting operation involves placing a housing component onto the electronic assembly—for example in order to protect said electronic assembly against environmental influences. A further advantage of this solution is that the electrical connection can be interrupted again by removing the housing component. This may be advantageous when the electronic assembly is intended to be subject to repair work and disassembly of components is required for this purpose.

In one embodiment, the electrical heating device is connected to said electronic circuit by means of a switch, in particular a mechanical switch, a diode, a transistor or a relay. The switch may already be provided when fitting components to the substrate, as a result of which additional expenditure on mounting can advantageously be kept low. After conclusion of thermal mounting, no further mounting steps are required, but rather merely a switching process which is possible with the aid of the switch which is already mounted and with which contact has been made by the electronic circuit. A mechanical switch can be manually operated, wherein it is necessary to ensure that the switch is opened during fitting of components or thereafter, so that there is DC isolation during the subsequent thermal mounting. Diodes and transistors are advantageously mounted such that there is a blocking effect, which protects the electronic circuit which is being produced against damage, while power is being supplied to the heating device during the thermal mounting process. The characteristics of the transistors and diodes is selected such that the heating device can be actuated by means of the circuit in question, that is to say there is no blocking effect, during operation of the electronic circuit. If a relay is used, said relay is connected to the electronic circuit in such a way that said relay can be switched on for the purpose of operation of the heating device during operation of the electronic circuit.

In one embodiment, the substrate is locally heated at different intensities during the thermal mounting process. As a result, different thermal mounting processes can be executed at the same time. For example, it is possible to join subregions of the electronic circuit using a thermal adhesive and at the same time to form solder connections at another location on the electronic circuit. It is also feasible to compensate for stresses, which are produced on account of inhomogeneities of the electronic assembly, by means of heating the substrate differently.

It may be advantageous when a temperature sensor which is electrically connected to said electronic circuit is provided on the substrate. This temperature sensor can be used for thermal management of the electronic assembly during operation of said assembly. For example, the temperature of an electronic assembly can be controlled in such a way that, when there is a threat of moisture deposition on the electronic assembly (condensation), the heating device is activated, so that moisture is not deposited on the electronic assembly. To this end, a moisture sensor can also be used, in addition to a temperature sensor, in order to establish whether the atmospheric moisture is actually so high that there is a risk of condensation. The temperature can advantageously also be used in order to monitor the temperature control of the substrate during the thermal mounting. To this end, it is provided according to an advantageous refinement of the method that an external control apparatus makes contact with the temperature sensor during the thermal mounting process. Here, the control apparatus is provided by a mounting system in which the production method proceeds. The control device is used in order to control the energy supply to the heating device.

It may be advantageous when the temperature sensor is electrically operated independently of the electronic circuits, which are formed by the electronic assembly, during the thermal mounting process. As a result, measurement errors which could occur during the thermal mounting of the electronic assembly can be avoided, so that the temperature signal from the temperature sensor can be reliably operated by the control apparatus which is provided by the mounting system. The temperature sensor is then advantageously connected to at least one of the electronic circuits of the electronic assembly after the mounting process, wherein the heating device can be operated by this electronic circuit at the same time. Therefore, the temperature sensor is available for thermal management of the electronic assembly after conclusion of the mounting method.

As already mentioned, the method according to the invention can also be used for disassembly. The substrate may be heated with the aid of the heating device to a temperature such that a thermal disassembly process is assisted. The heating device is electrically operated independently of the electronic circuits, which are formed by the electronic assembly, during the thermal disassembly process, so that these electronic circuits are not put at risk. If the disassembly method is used only for repairing the electronic assembly, this advantageously ensures that the electronic circuits which do not require repair are not damaged. The component which is intended to be replaced can be removed from the substrate after the thermally mounted connections are broken. The thermal connections may be, for example, solder connections. After the disassembly process or after a mounting process, which follows the disassembly process, for fitting a new component, the heating device is again electrically connected to at least one of the electronic circuits of the electronic assembly in accordance with the method described above, wherein the heating device is also operated with precisely this circuit.

The specified object is also achieved by the electronic assembly mentioned in the introductory part, which electronic assembly is designed in such a way that the heating device is electrically connected to at least one of the electronic circuits of the electronic assembly, wherein the heating device can be operated by said electronic circuit. In addition, a contact structure which is accessible from the outside is provided between the heating device and said electronic circuit. Accessible from the outside means that it is possible for electrical contact to be made from outside the electronic assembly (at least when said electronic assembly does not have a housing). This is required within the meaning of the invention so that mounting processes and disassembly processes can be carried out with external electrical contact being made with the heating device (as already described).

In one embodiment, the contact structure is connected to a switch. The switch makes it possible to control the temperature of the electronic assembly during operation by the switch creating an electrical connection to said electronic circuit. This electrical connection can then be disconnected again for a disassembly process (for example repair soldering).

Furthermore, the heating device may have a plurality of segments which can be individually actuated. In this way, a temperature profile can be generated both during the thermal mounting and also during operation of the electronic assembly. As already mentioned, the individual requirements of individual component connections and also individual electronic components can be taken into consideration during the thermal mounting. This is likewise possible during operation of the electronic assembly. For example, only those parts of the electronic assembly in which condensation has to be avoided can be subject to temperature control. It is also feasible for certain components to have to be operated at a specific temperature, said temperature then having to be maintained only in the relevant part of the electronic assembly. Energy consumption can advantageously be reduced when only the required parts of the electronic assembly are heated.

The segments in the substrate can advantageously also lie one beneath the other, and not only next to one another, with respect to the mounting side of the substrate. This has the advantage that certain regions of the substrate can be subject to greater heating than others if it can already be foreseen that greater heating is required in these regions. In this case, standardized heating elements can be used, wherein the quantity of heat is achieved not by a different capacity of the heating elements but rather by the stack-like design of said heating elements.

A substrate 11 in the form of a printed circuit board is used in the method according to FIG. 1. This substrate 11 is provided with an intermediate layer which inherently forms a thermosetting plastic matrix which is filled with dopants. The dopants are responsible for the electrical conductivity of this layer. The concentration of dopant lies above the percolation threshold, so that the intermediate layer 12 is electrically conductive. Examples of dopants which may be used include carbon nanotubes (CNT) or other carbon substances such as particles of carbon black or graphite. Metal or ceramic particles or mixtures of all of said types of dopant can also be used for establishing the conductivity. A plated-through hole 13 is used to connect the intermediate layer 12 to contact pads 14 on a mounting side 15 of the substrate 11, as a result of which a heating device 16 is formed.

The substrate 11 is held in a receptacle 17 of a mounting system, not illustrated in any more detail. The mounting system further provides a controller 18 with the aid of which probe needles 19, which have been lowered onto the contact pads 14, can be supplied with electric current. This current leads to the development of heat in the heating device 16, it being possible for said development of heat to be monitored by means of a temperature sensor 20. The temperature sensor 20 is also connected to the controller 18 by means of probe needles 21.

A component 23 is placed on the substrate 11 with the aid of a component-fitting head 22. A solder material 25 is provided on conductor tracks 24, so that contacts 26 of the component 23 can be immersed in the solder material 25. Subsequent heating of the substrate 11 by way of the heating device 16 leads to the solder material 25 being melted and solder connections 27 according to FIG. 2 being produced. As an alternative, the component-fitting head 22 can also be used for a disassembly process of the component 23 when a finished assembly 28 (cf. FIG. 2) is heated by way of the heating device 16 to such an extent that formed solder connections are melted again.

Figure 2:
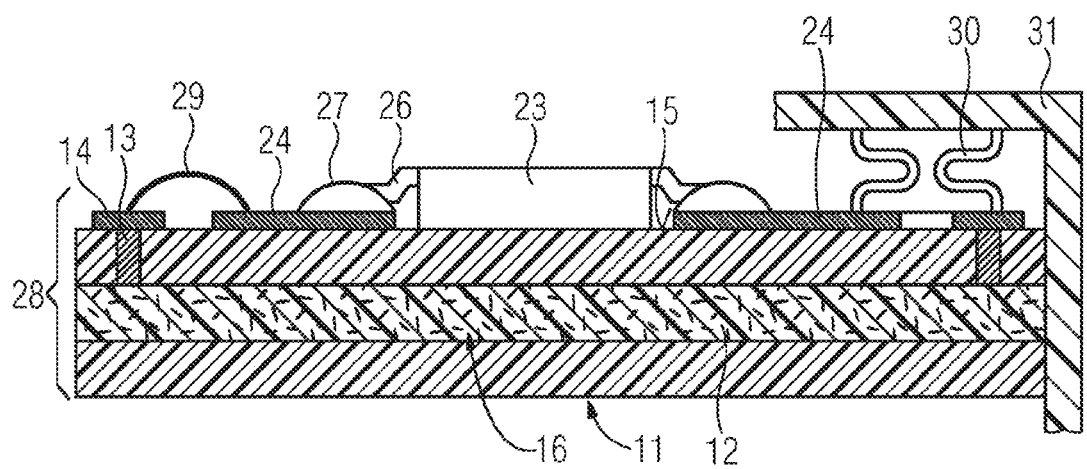

FIG. 2 shows a completely mounted electronic assembly 28. After removal of the assembly 28 from the mounting system, the heating device 16 was connected to the component 23 by an electrical connection having been formed between the conductor tracks 24 and the contact pads 14 in each case. Said connection can consist of a further solder connection 29 or of a contact piece 30, wherein the contact piece automatically creates an electrical connection between the conductor track 24 and the contact pad 14 during assembly of the housing component 31. The contact piece is of elastic design, so that a reliable contact-connection is made.

Figure 3:
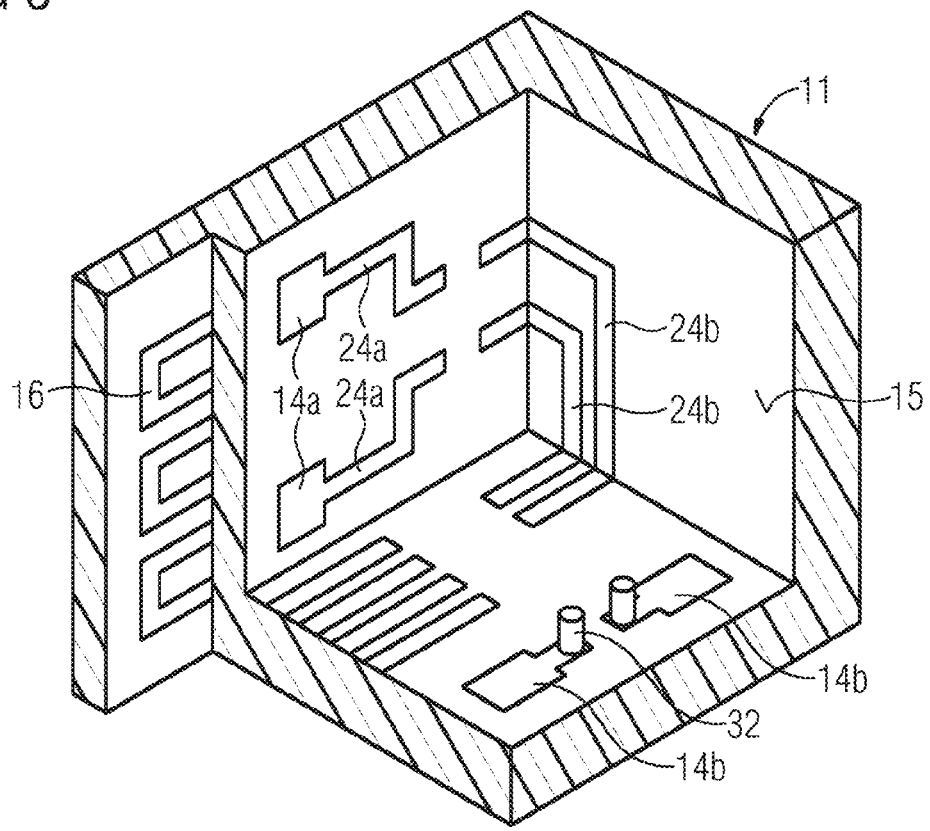
FIG. 3 shows a detail of an exemplary embodiment of an electronic assembly with a housing as substrate.

According to FIG. 3, the substrate 11 comprises a housing. Said housing serves as a circuit carrier at the same time. A heating device 16 in the form of a conductor path is illustrated in the material of the housing wall by way of example. Contact pads 14a make contact with this heating device 16 (not illustrated in any more detail). Moreover, the contact pads 14a have conductor tracks 24a on which a switch (not illustrated) can be fitted. Further conductor tracks 24b lead to an installation area for a component, not illustrated, which actuates the heating device 16 by means of the switch during subsequent operation of the electronic assembly.

A further heating device, not illustrated, is actuated by means of the contact pads 14b. The contact pads 14b are equipped with plug contacts 32 which allow electrical contact to be made by means of plug connectors after thermal mounting has taken place. In this way, the heating device, not illustrated, can likewise be connected to the electronic assembly by means of the plug connector.

Figure 4:
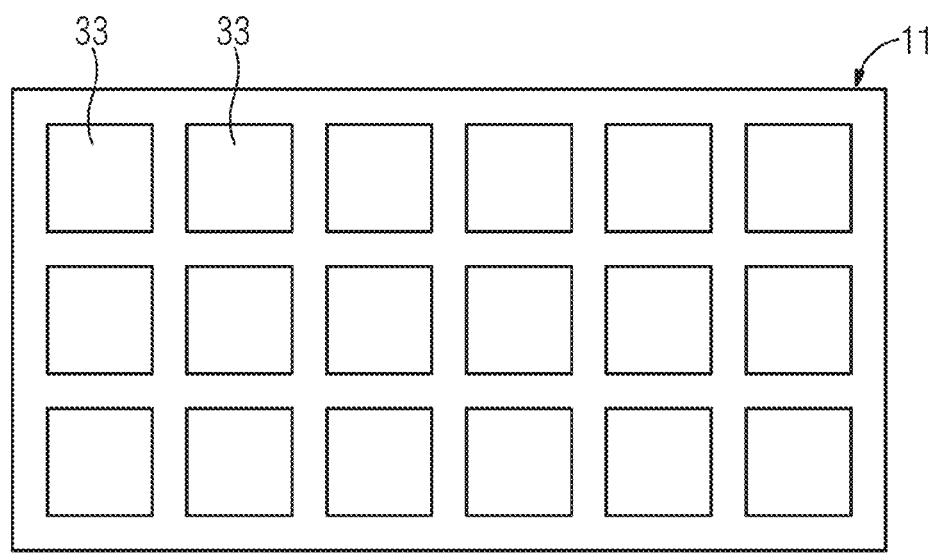
FIGS. 4 and 5 show a plan view and a side view of embodiments of a substrate with segmented heating devices.
Figure 5:
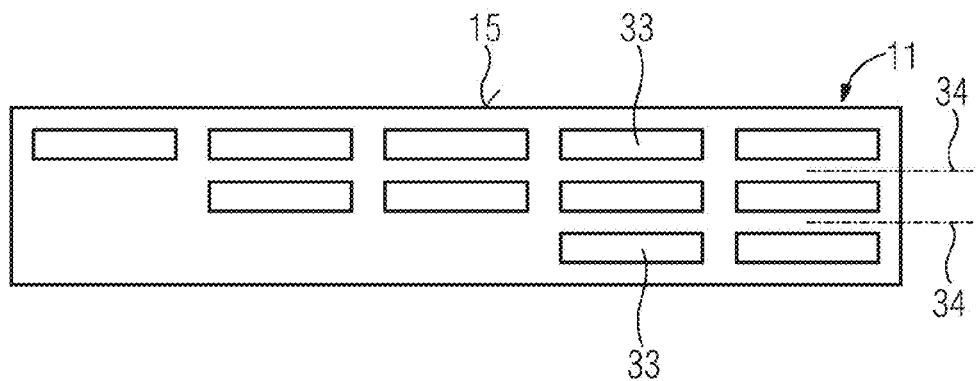

FIG. 4 shows that a heating device can also be formed by a plurality of segments 33, wherein the exact design of these segments is not illustrated in any more detail. As shown by FIG. 4, the segments 33 are uniformly distributed over the substrate 11 in the form of a grid (the mounting side of the substrate 11 is not shown since said mounting side is located above the segments 33). As a result, a desired temperature profile of the substrate 11 during the thermal mounting and later of the mounted assembly (not illustrated) can be established by actuating the segments individually. Although not illustrated, it goes without saying that it is likewise possible for segments 33 to be distributed in a non-uniform manner over the surface of the substrate 11. FIG. 5 shows a substrate in section, wherein segments 33 of the heating device are likewise shown. It should be noted here that a plurality of segments can also be arranged one above the other in planes, wherein a higher heating intensity can be generated in regions of the substrate 11 in which a plurality of segments 33 are located one above the other. Whereas the segments 33 according to FIG. 4 can, in principle, be electrically actuated by means of plated-through holes 13 in the manner illustrated in FIG. 1, it is necessary according to FIG. 5 for electrically conductive layers in the substrate 11 to be provided one above the other in order to make contact with a plurality of segments 33 independently. Said layers are not illustrated in any more detail but lie in the planes which are illustrated by dash-and-dot lines. Individual actuation of the segments which are situated one above the other is possible only by means of the planes 34. However, as an alternative, it is also feasible for the segments 33 which are situated one above the other to each be jointly supplied with power through a plated-through hole similarly to in FIG. 1.

Figure 6:
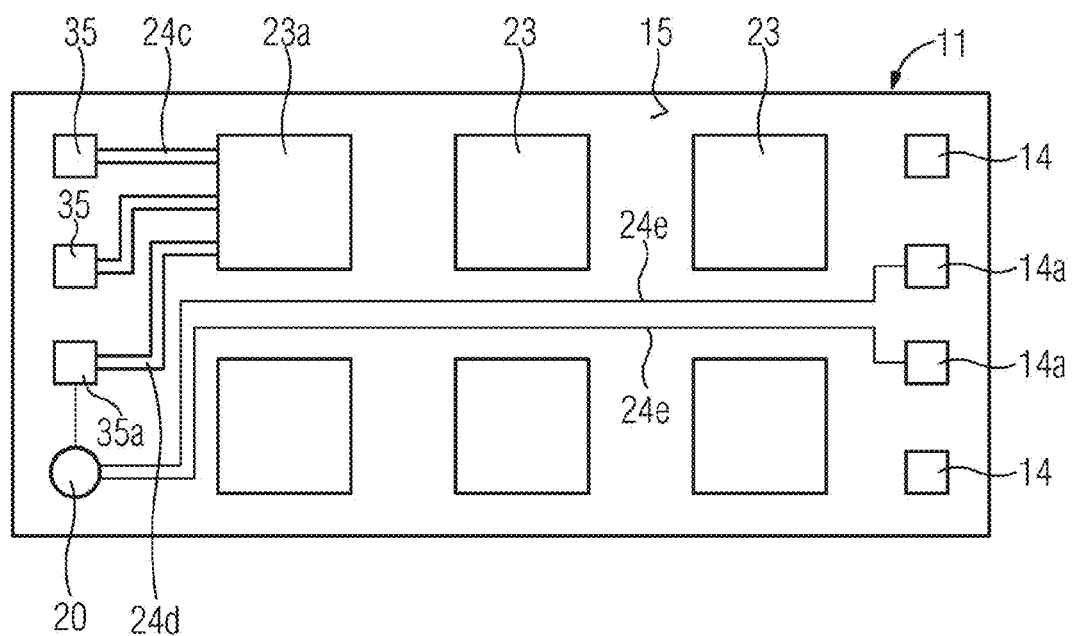
FIG. 6 shows a plan view of a further exemplary embodiment of an electronic assembly.

FIG. 6 shows a plan view of a completely mounted assembly. Said figure shows a plurality of components 23, wherein component 23a is intended to take on thermal management of the assembly. To this end, conductor tracks 24c lead to switches 35 which actuate heating devices, not illustrated in any more detail, in the substrate 11. The contact pads 14 which served to actuate the heating device during thermal mounting remain unused during operation of the assembly.

A switch 35a which actuates the temperature sensor 20 is also provided. Said switch is connected to the component 23a by means of a conductor track 24d. The temperature sensor 20 was also used by means of conductor tracks 24e during thermal mounting, wherein the signal from the temperature sensor 20 was externally tapped off by means of contact pads 14a.

What is claimed is:

1. A method for producing an electronic assembly, the method comprising:
   providing a substrate having a mounting surface that defines a mounting side for components,
   embedding an electrical heating device into the substrate beneath the mounting surface,
   mounting components on the mounting side of the substrate,
   heating the substrate using the heating device to a temperature that assists a thermal mounting process,
      wherein the heating device is electrically operated independently of circuits formed by the electronic assembly during the thermal mounting process, and
      wherein the heating device is electrically connected to at least one circuit of the electronic assembly after the thermal mounting process, wherein the at least one circuit is configured to operate the heating device.

2. The method of claim 1, wherein the mounting process includes soldering, adhesive bonding, or coating.

3. The method of claim 1, comprising supplying the heating device with electrical energy using probe needles or terminals during the thermal mounting process.

4. The method of claim 1, wherein the electrical heating device is connected to said electronic circuit via plug contacts or solder connections.

5. The method of claim 1, wherein the electrical heating device is connected to said electronic circuit by contact pieces integrated into a housing component for the electronic assembly, wherein he contact pieces are electrically connected by mounting the housing component on the electronic assembly.

6. The method of claim 1, wherein the electrical heating device is connected to said electronic circuit by a mechanical switch, a diode, a transistor, or a relay.

7. The method of claim 1, comprising locally heating the substrate at different intensities during the thermal mounting process.

8. The method of claim 1, wherein a temperature sensor electrically connected to said electronic circuit is provided on the substrate.

9. The method of claim 8, wherein:
   an external control apparatus makes contact with the temperature sensor during the thermal mounting process,
   the control apparatus is provided by a mounting system in which the production method is performed, and
   the control apparatus is configured to control the energy supply to the heating device.

10. The method of claim 9, wherein:
    during the thermal mounting process, the temperature sensor is electrically operated independently of the electronic circuits formed by the electronic assembly, and
    he temperature sensor is electrically connected to at least one of the electronic circuits of the electronic assembly after the mounting process, wherein the at least one electronic circuit is configured to operate the heating device.

11. A method for disassembling at least one part of an electronic assembly, comprising:
    h providing a substrate having a mounting surface that defines a mounting side for components,
    embedding an electrical heating device into said substrate beneath the mounting surface,
    mounting components on the mounting side of the substrate,
    wherein the substrate is heated by the heating device to a temperature that assists thermal disassembly process,
    during the thermal disassembly process, the heating device is electrically operated independently of electronic circuits formed by the electronic assembly,
    removing at least one component from the substrate, and
    electrically connecting the heating device to at least one of the electronic circuits of the electronic assembly after the disassembly process or after a component mounting process that follows the disassembly process, wherein the at least one electronic circuit is configured to operate the heating device.

12. An electronic assembly, comprising:
    a substrate having a mounting surface that defines a mounting side for components,
    an electrical heating device embedded in said substrate beneath the mounting surface,
    components mounted on the mounting side of the substrate, wherein the components define at least one electronic circuit,
    herein the heating device is electrically connected to at least one of the electronic circuits of the electronic assembly, wherein the at least one electronic circuit is configured to operate the heating device, and
    a contact structure arranged between the heating device and said electronic circuit and accessible from outside the electronic assembly.

13. The electronic assembly of claim 12, wherein the contact structure is connected to a switch.

14. The electronic assembly of claim 12, wherein the heating device has a plurality of segments that individually actuatable.

15. The electronic assembly of claim 14, wherein the segments in the substrate lie one beneath the other with respect to the mounting side of the substrate.

\* \* \* \* \*